(12) United States Patent
DeCesaris et al.

(10) Patent No.: US 9,384,787 B2
(45) Date of Patent: Jul. 5, 2016

(54) SELECTING A VOLTAGE SENSE LINE THAT MAXIMIZES MEMORY MARGIN

(71) Applicant: Lenovo Enterprise Solutions (Singapore) Pte. Ltd., Singapore (SG)

(72) Inventors: Michael DeCesaris, Carrboro, NC (US); Luke D. Remis, Raleigh, NC (US); Brian C. Totten, Durham, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/476,087

(22) Filed: Sep. 3, 2014

(65) Prior Publication Data

US 2016/0064042 A1 Mar. 3, 2016

(51) Int. Cl.
*G11C 5/14* (2006.01)
*G06F 1/26* (2006.01)
*G11C 5/04* (2006.01)

(52) U.S. Cl.
CPC ........... *G11C 5/147* (2013.01); *G06F 1/26* (2013.01); *G11C 5/04* (2013.01)

(58) Field of Classification Search
CPC .......... G11C 5/147; G11C 29/50; G11C 5/04; G06F 1/26
See application file for complete search history.

(56) References Cited

U.S. PATENT DOCUMENTS

| | | | |
|---|---|---|---|
| 5,483,489 A | 1/1996 | McClure | |
| 5,835,420 A | 11/1998 | Lee et al. | |
| 6,031,362 A | 2/2000 | Bradley | |
| 6,191,976 B1 | 2/2001 | Smayling et al. | |
| 6,456,557 B1 | 9/2002 | Dadashev et al. | |
| 7,274,602 B2 | 9/2007 | Arakawa | |
| 8,023,356 B2 | 9/2011 | Oh et al. | |
| 8,456,928 B2 | 6/2013 | Mutnury et al. | |
| 8,553,469 B2 | 10/2013 | Berke | |
| 8,665,656 B2 | 3/2014 | Jang | |
| 2010/0115179 A1* | 5/2010 | Carr | G11C 5/04 711/103 |
| 2013/0185581 A1 | 7/2013 | Michalak et al. | |

* cited by examiner

*Primary Examiner* — J. H. Hur
(74) *Attorney, Agent, or Firm* — Katherine S. Brown; Jeffrey L. Streets

(57) ABSTRACT

A computer program product includes a computer readable storage medium embodying program instructions executable by a processor to perform a method. The method includes sequentially passing a voltage signal from each voltage sense line pair to a voltage feedback line of a voltage regulator. The voltage regulator controls voltage to the memory system responsive to the voltage signal received at the voltage feedback line, wherein the memory system includes a plurality of voltage sense line pairs in different locations. For each voltage sense line pair, the method identifies a memory margin based on memory operation while regulating voltage responsive to the voltage signal from the voltage sense line pair. The voltage sense line pair that provides the greatest memory margin is identified, and the voltage regulator is made to control voltage to the memory system responsive to the identified voltage sense line pair.

16 Claims, 3 Drawing Sheets

SELECTING A VOLTAGE SENSE LINE THAT MAXIMIZES MEMORY MARGIN

BACKGROUND

1. Field of the Invention

The present invention relates to voltage regulation in a memory system.

2. Background of the Related Art

Computer systems of all types and sizes require memory. A computer system may have a motherboard or other printed circuit board with sockets configured to receive memory modules. A user may fully or partially populate the sockets available within a memory system with memory modules depending upon the desired performance of the computer system. Furthermore, the installed memory modules may differ from one another and may have different electrical characteristics.

The memory modules operate on electrical power that is typically received through a distribution plane formed in the motherboard or other printed circuit board to which the sockets are secured. The configuration of memory modules in the memory system may differ from one computer system to another, and may differ over time as memory modules are added, removed, replaced or upgraded.

BRIEF SUMMARY

One embodiment of the present invention provides a computer program product comprising a computer readable storage medium having program instructions embodied therewith, where the program instructions are executable by a processor to cause the processor to perform a method. The method comprises sequentially passing a voltage signal from each of the voltage sense line pairs to a voltage feedback line of a voltage regulator to a memory system, wherein the voltage regulator controls voltage to the memory system responsive to the voltage signal received at the voltage feedback line, and wherein the memory system includes a plurality of voltage sense line pairs in different locations within the memory system. The method further comprises identifying, for each voltage sense line pair, a memory margin of the memory system based on memory operation while regulating voltage to the memory system responsive to the voltage signal from the voltage sense line pair, identifying the voltage sense line pair that provides the greatest memory margin, and then causing the voltage regulator to control the memory system responsive to the identified voltage sense line pair.

Another embodiment of the present invention provides a computer program product comprising a computer readable storage medium having program instructions embodied therewith, where the program instructions are executable by a processor to cause the processor to perform a method. The method comprises identifying the location of each memory modules present in a memory system, wherein the memory system includes a plurality of voltage sense line pairs in different locations within the memory system, identifying one of the voltage sense line pairs that provides the shortest aggregate distance to each of the installed memory modules, and causing a voltage regulator to control voltage to the memory system responsive to the identified voltage sense line pair.

DETAILED DESCRIPTION

Figure 1:
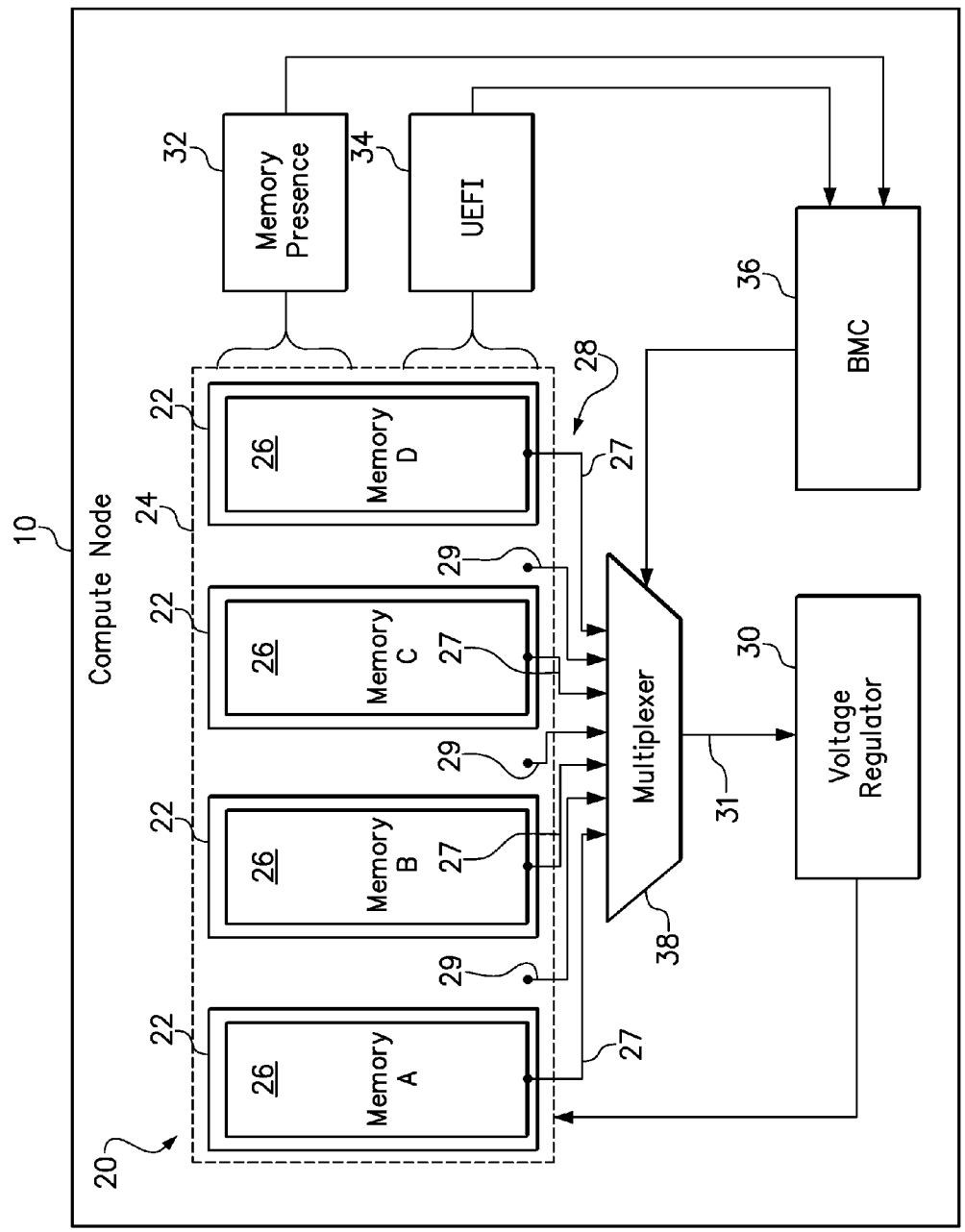
FIG. 1 is a diagram of a memory system facilitating one or more embodiments of the present invention.

One embodiment of the present invention provides a method comprising regulating voltage to a memory system responsive to a voltage signal received at a voltage feedback line, wherein the memory system includes a plurality of voltage sense line pairs in different locations within the memory system. The method further comprises sequentially passing a voltage signal from each of the voltage sense line pairs to the voltage feedback line, and, for each voltage sense line pair, calculating a memory margin of the memory system based on memory operation while regulating voltage to the memory system responsive to the voltage signal from the voltage sense line pair. Still further, the method comprises identifying the voltage sense line pair that provides the greatest memory margin, and then regulating voltage to the memory system responsive to the identified voltage sense line pair.

The memory system may include a plurality of memory modules, which may all be the same memory type or may include multiple memory types. A preferred memory module is a dual inline memory module (DIMM). The memory system may be included in a compute node, such as being included on a motherboard. Frequently, a memory system may have a non-uniform distribution of memory margin at each memory module location.

A voltage regulator may be used to regulate or control voltage to the memory system. For example, the voltage regulator may include a voltage feedback line for receiving a voltage signal from a voltage sense line pair. The voltage regulator typically provides voltage to an electrically conductive distribution plane within a printed circuit board that supports memory module sockets. When a memory module is installed into one of the memory module sockets, the memory module receives electricity from the distribution plane to support operation of the memory module The voltage regulator is responsive to the voltage signal provided to the voltage feedback line. Various embodiments of the present invention may include a multiplexer having inputs for receiving voltage signals from the plurality of voltage sense line pairs and an output that is coupled to the voltage feedback line of the voltage regulator. By controlling the multiplexer, a voltage signal from any of the voltage sense line pairs may be selectively provided to the voltage feedback line. Various embodiments of the present invention will sequentially provide a voltage signal from each of the voltage sense line pairs to the voltage feedback line during a test mode, then provide the voltage signal from a selected one of the voltage sense line pairs to the voltage feedback line during an operating mode.

The plurality of voltage sense line pairs are located at different locations within the memory system. Optionally, each of the voltage sense line pairs is located at one of memory module sockets. However, the number and location of a voltage sense line pair is not limited to the number or location of the memory module sockets. For example, a voltage sense line pair may be in contact with the distribution plane at a location between two adjacent memory module sockets or adjacent any one of the memory module sockets.

In various embodiments, the method may identify the voltage sense line pair that provides the greatest memory margin in response to powering on the memory system or in response to detecting a change in memory configuration. For example, the step of sequentially passing a voltage signal from each of the voltage sense line pairs to the voltage feedback line, the step of, for each voltage sense line pair, calculating a memory margin of the memory system based on memory operation while regulating voltage to the memory system responsive to the voltage signal from the voltage sense line pair, and the step of identifying the voltage sense line pair that provides the greatest memory margin, may occur in response to powering on the memory system or in response to detecting a change in memory configuration.

A "memory margin", which may also be referred to as a "voltage margin", relates to the difference between the minimum and maximum voltage at which a memory subsystem, such as an individual memory module, can run. The memory margin for a memory system having multiple memory subsystems or modules is only as high as the lowest memory margin for any of the memory subsystems or modules within the memory system. Accordingly, embodiments of the present invention regulate voltage to the distribution plane using voltage feedback from a voltage sense line pair that has been empirically determined to result in the greatest memory margin for the memory system.

Another embodiment of the present invention provides a method, comprising a voltage regulator providing voltage to a memory system responsive to a voltage signal received at a voltage feedback line, wherein the memory system includes a plurality of voltage sense line pairs in different locations within the memory system. According to the method, a baseboard management controller (BMC) instructs a multiplexer to sequentially pass a voltage signal from each of the voltage sense line pairs to the voltage feedback line, and, for each voltage sense line pair, a unified extensible firmware interface (UEFI) calculates a memory margin of the memory system based on memory operation while regulating voltage to the memory system responsive to the voltage signal from the voltage sense line pair. The method further comprises identifying the voltage sense line pair that provides the greatest memory margin, and then the baseboard management controller instructing the multiplexer to provide the identified voltage sense line pair to the voltage feedback line of the voltage regulator.

The baseboard management controller may be a conventional service processor executing program instructions to perform one or more steps of the methods, such as instructing a multiplexer to sequentially pass a voltage signal from each of the voltage sense line pairs to the voltage feedback line and instructing the multiplexer to provide the identified voltage sense line pair to the voltage feedback line of the voltage regulator. In a separate option, the baseboard management controller is responsible for identifying the voltage sense line pair that provides the greatest memory margin. Still, a unified extensible firmware interface (UEFI) may calculate memory margin and report the calculated memory margins to the baseboard management controller. The unified extensible firmware interface is a software interface between an operating system and platform firmware.

Yet another embodiment of the present invention provides a method comprising regulating voltage to a memory system responsive to a voltage signal received at a voltage feedback line, wherein the memory system includes a plurality of voltage sense line pairs in different locations within the memory system. The method further comprises identifying the location of each of the memory modules present in the memory system, identifying the voltage sense line pair that provides the shortest aggregate distance to each of the installed memory modules, and then regulating voltage to the memory system responsive to the identified voltage sense line pair. In this embodiment, the voltage sense line pair that provides the shortest aggregate distance to each of the installed memory modules is seen to be the most representative of the voltage at each memory module. Optionally, the method may further comprise identifying the voltage sense line pair in consideration of the expected current to each of the installed memory modules. The expected amount of current to an individual memory module may either be measured or correlated to the amount of data allocated in a particular bank by the memory controller. Whereas memory module sockets without a memory module are given no consideration in the selection of a voltage sense line pair, a voltage sense line pair may be selected by prioritizing or weighting each memory modules according to the amount of current drawn by the memory module. For example, a memory module drawing low current will be given a lower priority or weighting in the selection of a voltage sense line pair than a memory module drawing higher current, since the voltage accuracy or level is less important for a memory module drawing lower current. For example, if the memory controller knows that 8 GB of data is stored in DIMM location A and that 128 MB is located in DIMM location D, then the selection of a voltage sense line pair should be weighted near the DIMM location A. The memory with the most load may be assumed to have the lowest voltage potential and needs the voltage compensation. In a simple implementation, each of the voltage sense line pairs is located at a memory module socket.

A further embodiment of the present invention provides a computer program product comprising a computer readable storage medium having program instructions embodied therewith, where the program instructions are executable by a processor to cause the processor to perform a method. The method comprises sequentially passing a voltage signal from each of the voltage sense line pairs to a voltage feedback line of a voltage regulator to a memory system, wherein the voltage regulator controls voltage to the memory system responsive to the voltage signal received at the voltage feedback line, and wherein the memory system includes a plurality of voltage sense line pairs in different locations within the memory system. The method further comprises identifying, for each voltage sense line pair, a memory margin of the memory system based on memory operation while regulating voltage to the memory system responsive to the voltage signal from the voltage sense line pair, identifying the voltage sense line pair that provides the greatest memory margin, and then causing the voltage regulator to control the memory system responsive to the identified voltage sense line pair.

The foregoing program instructions may be performed by a baseboard management controller. In one related option, the baseboard management controller causes the voltage regulator to control the memory system responsive to the identified voltage sense line pair by controlling a multiplexer that receives input from each of the plurality of voltage sense line pairs and provides a single output to the voltage feedback line. In a separate option, the baseboard management controller may identify memory margins by receiving memory margins from a UEFI.

In various embodiments of the computer program product, the step of sequentially passing a voltage signal from each of the voltage sense line pairs to the voltage feedback line, the step of identifying, for each voltage sense line pair, a memory margin of the memory system based on memory operation while regulating voltage to the memory system responsive to the voltage signal from the voltage sense line pair, and the step of identifying the voltage sense line pair that provides the greatest memory margin, occur in response to powering on the memory system or in response to detecting a change in memory configuration.

Aspects of the method embodiments disclosed herein may be implemented in program instructions and aspects of the apparatus embodiments disclosed in reference to the methods may be implemented in reference to the computer program products. Accordingly, a discussion of those methods and apparatus are not repeated here in the context of a computer program product.

A still further embodiment of the present invention provides a computer program product comprising a computer readable storage medium having program instructions embodied therewith, where the program instructions are executable by a processor to cause the processor to perform a method. The method comprises identifying the location of each memory modules present in a memory system, wherein the memory system includes a plurality of voltage sense line pairs in different locations within the memory system, identifying one of the voltage sense line pairs that provides the shortest aggregate distance to each of the installed memory modules, and causing a voltage regulator to control voltage to the memory system responsive to the identified voltage sense line pair.

In this embodiment, the voltage sense line pair that provides the shortest aggregate distance to each of the installed memory modules is seen to be the most representative of the voltage at each memory module. Optionally, the method may further comprise identifying the voltage sense line pair in consideration of the expected current to each of the installed memory modules. In a simple implementation, each of the voltage sense line pairs is located at a memory module socket.

The foregoing computer program products may further include program instructions for implementing or initiating any one or more aspects of the methods described herein. Accordingly, a separate description of the methods will not be duplicated in the context of a computer program product.

FIG. 1 is a diagram of a compute node 10 having a memory system 20 facilitating one or more embodiments of the present invention. The memory system 20 includes four memory module sockets 22 in electronic communication with a voltage distribution plane 24. The voltage distribution plane 24 receives electrical power from a voltage regulator 30 and distributes electrical power to each of the sockets 22. As shown, each of the sockets 22 has received a memory module 26 (Memory A-D) and provides electrical power to the respective memory module. Accordingly, this memory system 20 is "fully populated".

The compute node 10 further includes memory presence detectors 32 for detecting the presence of a memory module 26 in a socket 22. A unified extensible firmware interface (UEFI) 34 is in communication with the memory modules 26 and can calculate a memory margin for each individual memory module 26. Both detectors 32 reports memory module presence (configuration) to a baseboard management controller (BMC) 36 and the UEFI 34 reports memory margin values to the BMC 36.

A multiplexer 38 has inputs coupled to a plurality of voltage sense line pairs 28 in different locations within the memory system, including some voltage sense line pairs 27 that are associated with the memory module sockets 22 and some voltage sense line pairs 29 that are not associated with the memory module sockets 22. The multiplexer 38 also has an output that selectively communicates the voltage signal from any one of the voltage sense line pairs 28 to a voltage feedback line 31 of the voltage regulator 30.

During a test mode, the BMC 36 may control the multiplexer 38 so that a voltage signal from each of the voltage sense line pairs 28 is sequentially passed to the voltage feedback line 31 of the voltage regulator 30. While each voltage sense line pair is in communication with the voltage feedback line 31, the voltage regulator 30 controls voltage to the distribution plane 24 of the memory system 20 responsive to the voltage signal provided by that particular voltage sense line pair. The UEFI 34 may identify a memory margin for each of the installed memory modules 26. The lowest memory margin among the memory modules 26 is the memory margin for the memory system when using the particular voltage sense line pair. As the different voltage sense line pairs 28 are sequentially passed to the voltage regulator, the UEFI calculates a new set of memory margins and determines the memory margin for the memory system based upon the lowest memory margin among the memory modules. As a result, the UEFI is able to identify, for each voltage sense line pair, a memory margin of the memory system based on memory operation while regulating voltage to the memory system responsive to the voltage signal from the voltage sense line pair. The UEFI 34 or the BMC 36 may then identify which of the voltage sense line pairs 28 provides the greatest memory margin.

During an operating mode, the BMC 36 controls the output of the multiplexer 38 to the voltage feedback line 31 in order to cause the voltage regulator 30 to control the voltage to the memory system 20 responsive to the identified voltage sense line pair. Optionally, in response to detecting a new memory module configuration, a change in memory module utilization or restarting of the compute node, the BMC may return to a test mode and identify the same or a different voltage sense line pair for subsequent use in the operating mode.

In an alternative embodiment, the memory presence detectors 32 detect which of the memory module sockets 22 have received a memory module 26 and reports the memory system configuration (installed memory module locations) to the BMC 36. Using data describing the known locations of the memory module sockets 22 and the voltage sense line pairs 28, the BMC 36 may then determine the voltage sense line pair that provides the shortest aggregate distance to each of the installed memory modules. For example, where the four socket memory system is fully populated with memory modules as shown, the shortest aggregate distance to each of the installed memory modules is the centrally located voltage sense line pair 29 (between Memory B and Memory C). In another example, if the memory system only includes Memory A, Memory B, and Memory C, then the voltage sense line pair that provides the shortest aggregate distance may be the voltage sense line pair 27 associated with Memory B. Other memory module configurations and combinations, as well as different available voltage sense line pairs, may result in the selection of a different voltage sense line pair. Accordingly, upon selection of the voltage sense line pair that provides the shortest aggregate distance to each of the installed memory modules, the BMC 36 may control the multiplexer 38 to cause the voltage signal from the selected voltage sense line pair to be passed to the voltage feedback line 31 of the voltage regulator 30. The voltage regulator 30 will then regulate the voltage provided to a memory system responsive to the voltage signal received at a voltage feedback line 31.

Figure 2:
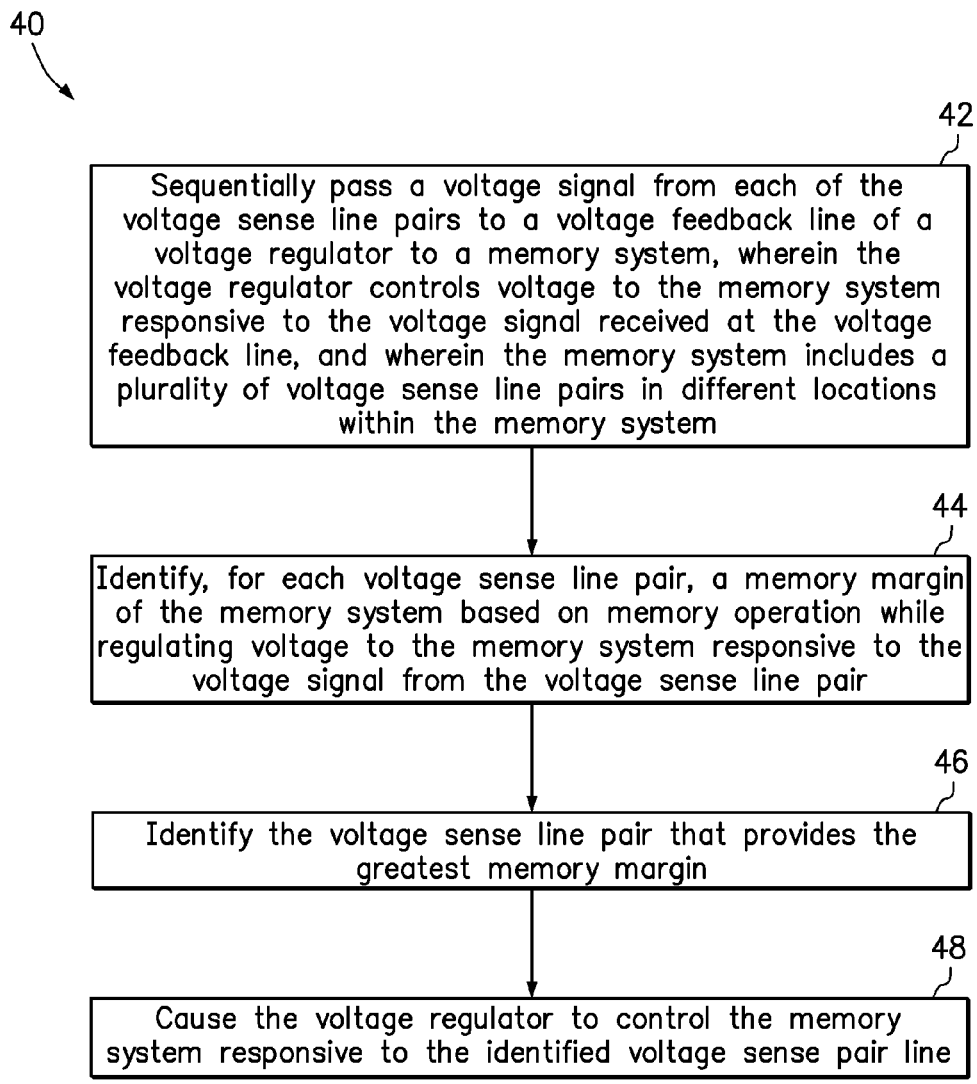
FIG. 2 is a flowchart of a first method according to one embodiment of the invention.

FIG. 2 is a flowchart of a first method 40 according to one embodiment of the invention. In step 42, a voltage signal from each of the voltage sense line pairs is sequentially passed to a voltage feedback line of a voltage regulator to a memory system, wherein the voltage regulator controls voltage to the memory system responsive to the voltage signal received at the voltage feedback line, and wherein the memory system includes a plurality of voltage sense line pairs in different locations within the memory system. In step 44, the method identifies, for each voltage sense line pair, a memory margin of the memory system based on memory operation while regulating voltage to the memory system responsive to the voltage signal from the voltage sense line pair. Step 46 identifies the voltage sense line pair that provides the greatest memory margin, and then step 48 causes the voltage regulator to control the memory system responsive to the identified voltage sense line pair.

Figure 3:
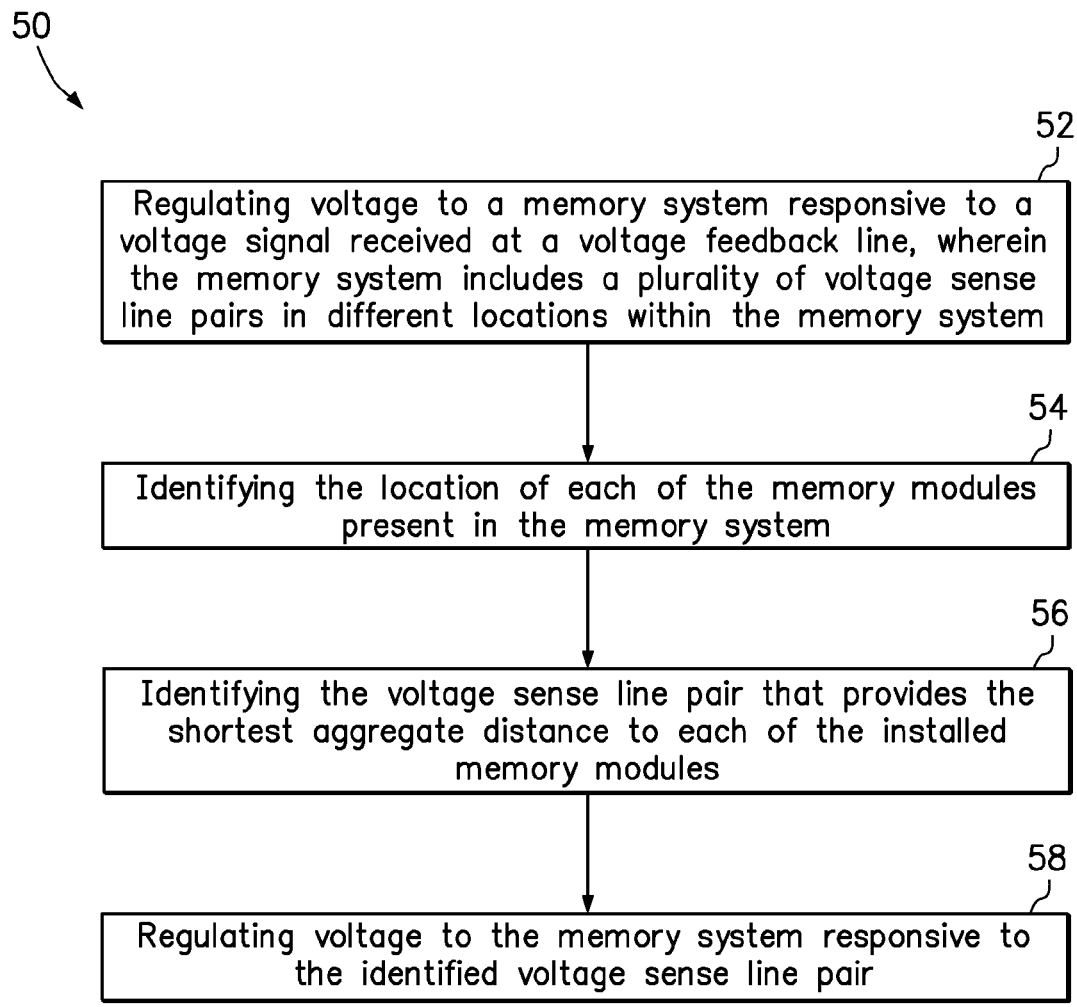
FIG. 3 is a flowchart of a second method according to another embodiment of the invention.

FIG. 3 is a flowchart of a second method 50 according to another embodiment of the invention. In step 52, the method regulates voltage to a memory system responsive to a voltage signal received at a voltage feedback line, wherein the memory system includes a plurality of voltage sense line pairs in different locations within the memory system. In step 54, the location of each of the memory modules present in the memory system is identified. The voltage sense line pair that provides the shortest aggregate distance to each of the installed memory modules is identified in step 56, and then voltage to the memory system is regulated responsive to the identified voltage sense line pair in step 58.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer program product comprising a non-transitory computer readable storage medium having program instructions embodied therewith, the program instructions executable by a processor to cause the processor to perform a method comprising:

sequentially passing a voltage signal from each of a plurality of voltage sense line pairs to a voltage feedback line of a voltage regulator to a memory system, wherein the voltage regulator controls voltage to the memory system responsive to the voltage signal received at the voltage feedback line, wherein the memory system includes a plurality of memory modules, and wherein the plurality of voltage sense line pairs are in different locations within the memory system;

identifying, for each voltage sense line pair, a memory margin of the memory system based on memory operation while regulating voltage to the memory system responsive to the voltage signal from the voltage sense line pair, wherein the memory margin of the memory system is equal to the lowest memory margin for any of the memory modules, and wherein the memory margin for each memory module is the difference between the minimum and maximum voltage at which the memory module can run;

identifying a voltage sense line pair that provides a greatest memory margin; and then causing the voltage regulator to control the memory system responsive to the identified voltage sense line pair.

2. The computer program product of claim 1, wherein the memory system includes multiple memory types.

3. The computer program product of claim 1, wherein the memory system has a non-uniform distribution of memory margin at each memory location.

4. The computer program product of claim 1, wherein causing the voltage regulator to control the memory system responsive to the identified voltage sense line pair includes controlling a multiplexer that receives input from each of the plurality of voltage sense line pairs and provides a single output to the voltage feedback line.

5. The computer program product of claim 1, wherein the step of sequentially passing a voltage signal from each of the voltage sense line pairs to the voltage feedback line, the step of identifying, for each voltage sense line pair, a memory margin of the memory system based on memory operation while regulating voltage to the memory system responsive to the voltage signal from the voltage sense line pair, and the step of identifying the voltage sense line pair that provides the greatest memory margin, occur in response to powering on the memory system.

6. The computer program product of claim 1, wherein the step of sequentially passing a voltage signal from each of the voltage sense line pairs to the voltage feedback line, the step of identifying, for each voltage sense line pair, a memory margin of the memory system based on memory operation while regulating voltage to the memory system responsive to the voltage signal from the voltage sense line pair, and the step of identifying the voltage sense line pair that provides the greatest memory margin, occur in response to detecting a change in memory configuration.

7. The computer program product of claim 1, wherein the method is performed by a baseboard management controller.

8. The computer program product of claim 1, wherein the voltage regulator provides voltage to a voltage distribution plane from which the memory system receives voltage.

9. The computer program product of claim 1, wherein each of the plurality of voltage sense line pairs are located in contact with a voltage distribution plane at a plurality of memory module sockets.

10. The computer program product of claim 7, wherein the baseboard management controller identifies memory margins by receiving memory margins from a unified extensible firmware interface.

11. A method, comprising:

regulating voltage to a memory system responsive to a voltage signal received at a voltage feedback line, wherein the memory system includes a plurality of memory modules and a plurality of voltage sense line pairs in different locations within the memory system;

sequentially passing a voltage signal from each of the voltage sense line pairs to the voltage feedback line;

for each voltage sense line pair, calculating a memory margin of the memory system based on memory operation while regulating voltage to the memory system responsive to the voltage signal from the voltage sense line pair, wherein the memory margin of the memory system is equal to the lowest memory margin for any of the memory modules, and wherein the memory margin for each memory module is the difference between the minimum and maximum voltage at which the memory module can run;

identifying a voltage sense line pair that provides a greatest memory margin; and then regulating voltage to the memory system responsive to the identified voltage sense line pair.

12. The method of claim 11, wherein the memory system includes multiple memory types.

13. The method of claim 11, wherein the memory system has a non-uniform distribution of memory margin at each memory location.

14. The method of claim 11, further comprising:

controlling a multiplexer receiving input from each of the plurality of voltage sense line pairs and an output to the voltage feedback line.

15. The method of claim 11, wherein the step of sequentially passing a voltage signal from each of the voltage sense line pairs to the voltage feedback line, the step of, for each voltage sense line pair, calculating a memory margin of the memory system based on memory operation while regulating voltage to the memory system responsive to the voltage signal from the voltage sense line pair, and the step of identifying the voltage sense line pair that provides the greatest memory margin, occur in response to powering on the memory system.

16. The method of claim 11, wherein the step of sequentially passing a voltage signal from each of the voltage sense line pairs to the voltage feedback line, the step of, for each voltage sense line pair, calculating a memory margin of the memory system based on memory operation while regulating voltage to the memory system responsive to the voltage signal from the voltage sense line pair, and the step of identifying the voltage sense line pair that provides the greatest memory margin, occur in response to detecting a change in memory configuration.

* * * * *